United States Patent
Kitajima et al.

(10) Patent No.: US 11,303,095 B2
(45) Date of Patent: Apr. 12, 2022

(54) METHOD OF MANUFACTURING LIGHT EMITTING DEVICE, LIGHT EMITTING DEVICE, AND BASE MEMBER

(71) Applicant: NICHIA CORPORATION, Anan (JP)

(72) Inventors: Tadayuki Kitajima, Tokushima (JP); Tomokazu Taji, Anan (JP)

(73) Assignee: NICHIA CORPORATION, Anan (JP)

( * ) Notice: Subject to any disclaimer, the term of this patent is extended or adjusted under 35 U.S.C. 154(b) by 113 days.

(21) Appl. No.: 16/791,791

(22) Filed: Feb. 14, 2020

(65) Prior Publication Data

US 2020/0266605 A1 Aug. 20, 2020

(30) Foreign Application Priority Data

Feb. 15, 2019 (JP) .............................. JP2019-025299
Sep. 24, 2019 (JP) .............................. JP2019-172444

(51) Int. Cl.
*H01S 5/02375* (2021.01)
*H01S 5/00* (2006.01)

(52) U.S. Cl.
CPC ........ *H01S 5/02375* (2021.01); *H01S 5/0071* (2013.01)

(58) Field of Classification Search
CPC .. H01S 5/02375; H01S 5/0071; H01S 5/0087; H01S 5/00; H01S 5/4056; H01S 5/0233; H01S 5/0235; H01S 5/40
USPC ...................................................... 372/44.01
See application file for complete search history.

(56) References Cited

U.S. PATENT DOCUMENTS

| | | | |
|---|---|---|---|
| 6,256,437 B1* | 7/2001 | Sakushima | G02B 6/4224 385/147 |
| 8,982,920 B2* | 3/2015 | Watanabe | H01S 5/22 372/44.01 |
| 2009/0246898 A1 | 10/2009 | Steegmuller et al. | |
| 2012/0201259 A1* | 8/2012 | Watanabe | B82Y 20/00 372/36 |
| 2015/0280404 A1* | 10/2015 | Kasai | G02B 5/10 385/33 |
| 2016/0147025 A1* | 5/2016 | Sakamoto | G02B 6/4214 385/33 |
| 2016/0285234 A1* | 9/2016 | Okahisa | H01S 5/02255 |
| 2017/0314768 A1 | 11/2017 | Kiyota et al. | |

(Continued)

FOREIGN PATENT DOCUMENTS

EP 3029502 A1 6/2016
JP H11109184 A 4/1999

(Continued)

*Primary Examiner* — Tuan N Nguyen
(74) *Attorney, Agent, or Firm* — Global IP Counselors, LLP

(57) ABSTRACT

A method of manufacturing a light emitting device, the method including: disposing a first semiconductor laser element on a disposition surface of a base member such that a light emission end surface of the first semiconductor laser element is parallel to a first line passing through a pair of alignment marks provided on the base member; and disposing a first light-reflective member on the disposition surface such that a reference line for the first light-reflective member, which serves as an alignment reference in disposing the first light-reflective member, is parallel to a second line that is oblique to the first line at a predetermined angle.

15 Claims, 8 Drawing Sheets

(56) References Cited

U.S. PATENT DOCUMENTS

2017/0317469 A1 11/2017 Kiyota
2018/0309264 A1 10/2018 Kanskar et al.

FOREIGN PATENT DOCUMENTS

| JP | 2003195119 A | 7/2003 |
| JP | 2006269864 A | 10/2006 |
| JP | 2009081225 A | 4/2009 |
| JP | 2012164737 A | 8/2012 |
| JP | 2016184729 A | 10/2016 |
| JP | 2017199849 A | 11/2017 |
| JP | 2017201688 A | 11/2017 |

* cited by examiner

METHOD OF MANUFACTURING LIGHT EMITTING DEVICE, LIGHT EMITTING DEVICE, AND BASE MEMBER

CROSS REFERENCE TO RELATED APPLICATIONS

This application claims priority to Japanese Patent Application No. 2019-025299, filed on Feb. 15, 2019, and Japanese Patent Application No. 2019-172444, filed on Sep. 24, 2019, the entire disclosures of which are hereby incorporated herein by reference.

BACKGROUND

1. Technical Field

The present disclosure relates to a method of manufacturing a light emitting device, a light emitting device, and a base member adapted to be installed in the light emitting device.

2. Description of Related Art

There has been a known method in which an element such as a light emitting element is mounted on a mount surface according to an alignment mark formed on the mount surface. For example, JP 2012-164737 A describes a submount in which an alignment mark is formed on a first surface, where a semiconductor light emitting element is to be mounted, of the submount.

SUMMARY

In JP 2012-164737 A, only the mounting precision of a single semiconductor light emitting element, which is an element mounted on the mount surface, is considered. Meanwhile, when a plurality of elements are mounted on a single mount surface in an optical system, configuration for improving the mounting precision is required in a comprehensive standpoint.

A method of manufacturing a light emitting device according to the present disclosure includes: disposing a first semiconductor laser element on a disposition surface of a base member such that a light emission end surface of the first semiconductor laser element is parallel to a first line passing through a pair of alignment marks provided on the base member; and disposing a first light-reflective member on the disposition surface such that a reference line for the first light-reflective member, which serves as an alignment reference in disposing the first light-reflective member, is parallel to a second line that is oblique to the first line at a predetermined angle.

A light emitting device according to the present disclosure includes: a base member including a disposition surface, and including a pair of alignment marks; a semiconductor laser element disposed on the disposition surface; and a light-reflective member disposed on the disposition surface. The semiconductor laser element and the light-reflective member are disposed on the disposition surface such that a light emission end surface of the semiconductor laser element and an upper edge or a lower edge of a light-reflective surface of the light-reflective member form a predetermined angle without being perpendicular or parallel to each other in a top view. A line connecting the alignment marks and the light emission end surface of the semiconductor laser element are parallel to each other.

A base member according to the present disclosure includes: an upward-facing surface; an upper surface surrounding the upward-facing surface to form a rectangular frame in a top view, the rectangular frame having four sides including a first side, a second side intersecting with the first side, a third side opposite to the first side and intersecting with the second side, and a fourth side intersecting with the third side and the first side in a top view; a first metal film extending from a region corresponding to the first side to a region corresponding to the second side in the upper surface; and a second metal film extending from a region corresponding to the third side to a region corresponding to the fourth side. The first metal film includes a first conduction region configured to establish electrical connection in the region corresponding to the first side, and a first alignment region defining a first alignment mark in the region corresponding to the second side. The second metal film includes a second conduction region configured to establish electrical connection in the region corresponding to the third side, and a second alignment region defining a second alignment mark in the region corresponding to the fourth side.

The present disclosure allows a light emitting device to be precisely mounted. The present disclosure also allows for obtaining a light emitting device which can be precisely mounted. The present disclosure also allows for obtaining a base member that allows precise mounting.

DETAILED DESCRIPTION OF EMBODIMENTS

Figure 1:
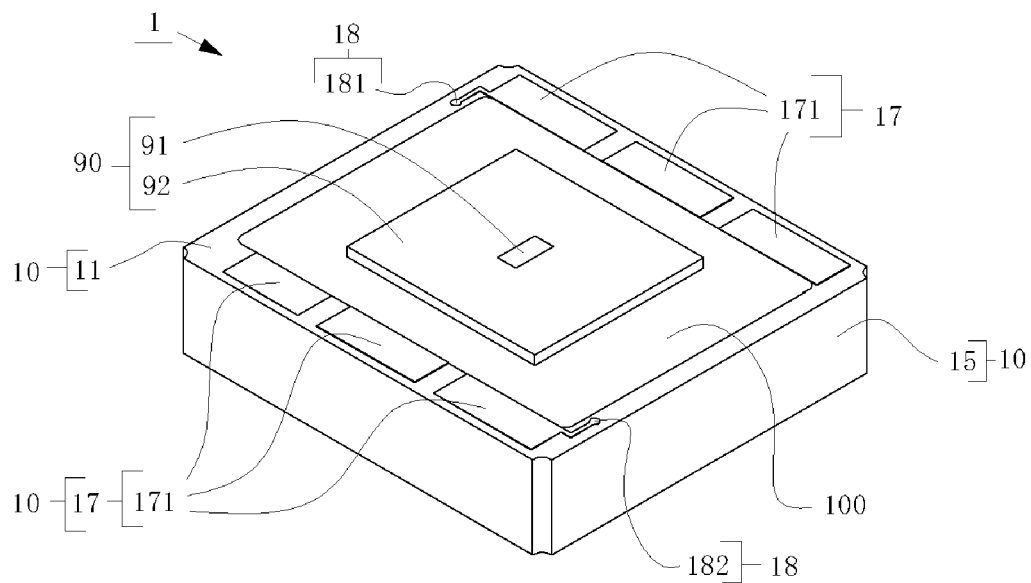
FIG. 1 is a schematic perspective view of a light emitting device according to a first embodiment.

In the description and the claims, the term "polygonal shape" encompasses polygonal shapes such as triangular shapes, quadrangular shapes, and the like with modified corners such as rounded corners, truncated corners, etc. The term "polygonal shape" also encompasses polygonal shapes with modification at intermediate portions of sides of the polygonal shapes (i.e., portions other than ends of sides of the polygonal corners). That is, a polygonal shape with modification is construed as "a polygon" recited in the description and claims.

Similarly, other terms indicating specific shapes, such as a circle, a recess, a projection, etc., encompasses respective shapes with modification. This is similar for each side forming such a shape. That is, a side having ends with modification and/or an intermediate portion with modification is construed as "a side". When indicating "a polygonal shape" or "a side" without intended modification separately from a modified "polygonal shape" or a modified "side", such shapes without intended modification are referred to with the term "exact", such as "an exact quadrangle".

In the description and claims, when a plurality of elements corresponds to a single constituent and are to be indicated separately from each other, the term of such elements are referred to with the words "first", "second", etc. Such indication of elements with the words "first", "second", etc., for indicating the elements corresponding to a single constituent separately from each other may be different between the description and claims, when the elements to be indicated as "first", "second", etc., or the view of separation between "first", "second", etc., is different between the description and claims.

With reference to the drawings, certain embodiments of the present invention will be described below. Embodiments described below are intended to give a concrete form to the technical idea of the present invention, and are not intended to limit the scope of the present invention. In the description below, identical names and identical reference numerals indicate identical or similar members, and repetitive description thereof may be omitted as appropriate. The size or positional relationship of members in the drawings may be exaggerated for the sake of clarity.

First Embodiment

Figure 2:
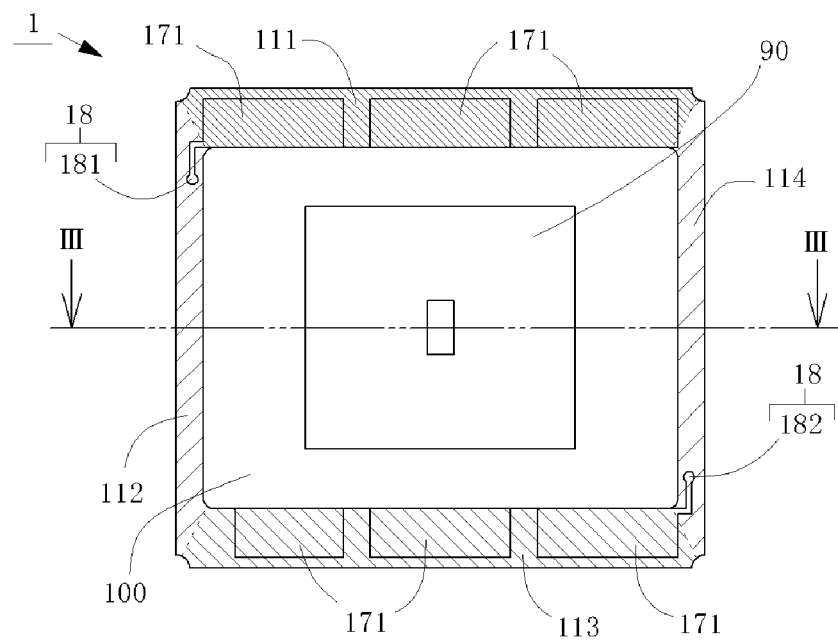
FIG. 2 is a schematic top view of the light emitting device shown in FIG. 1.
Figure 3:
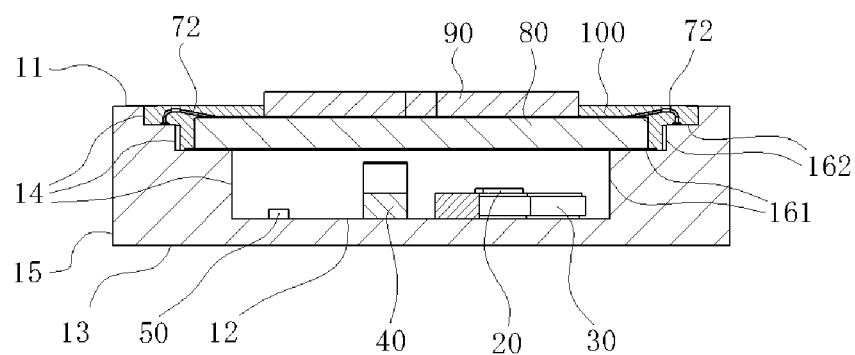
FIG. 3 is a schematic cross-sectional view of the light emitting device taken along line III-III in FIG. 2.
Figure 4:
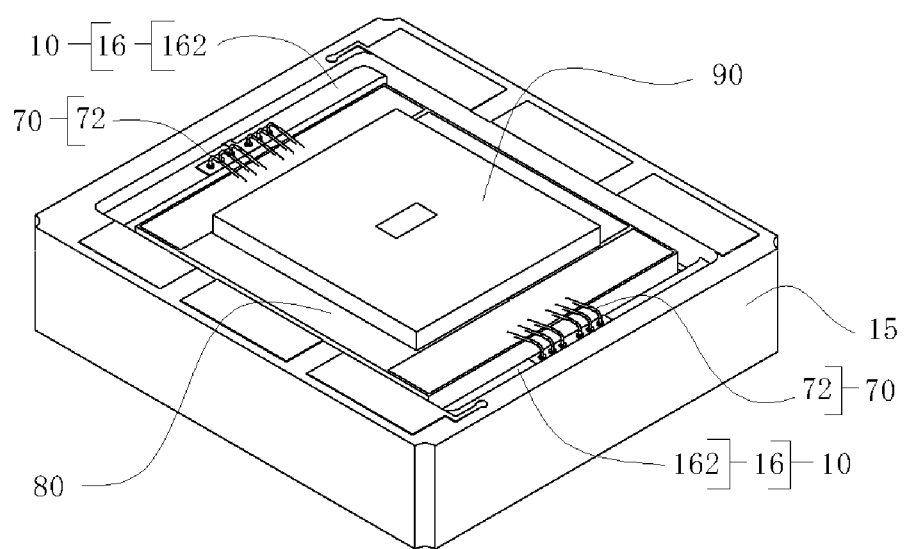
FIG. 4 is a schematic perspective view for describing the internal configuration of the light emitting device according to the first embodiment.
Figure 5:
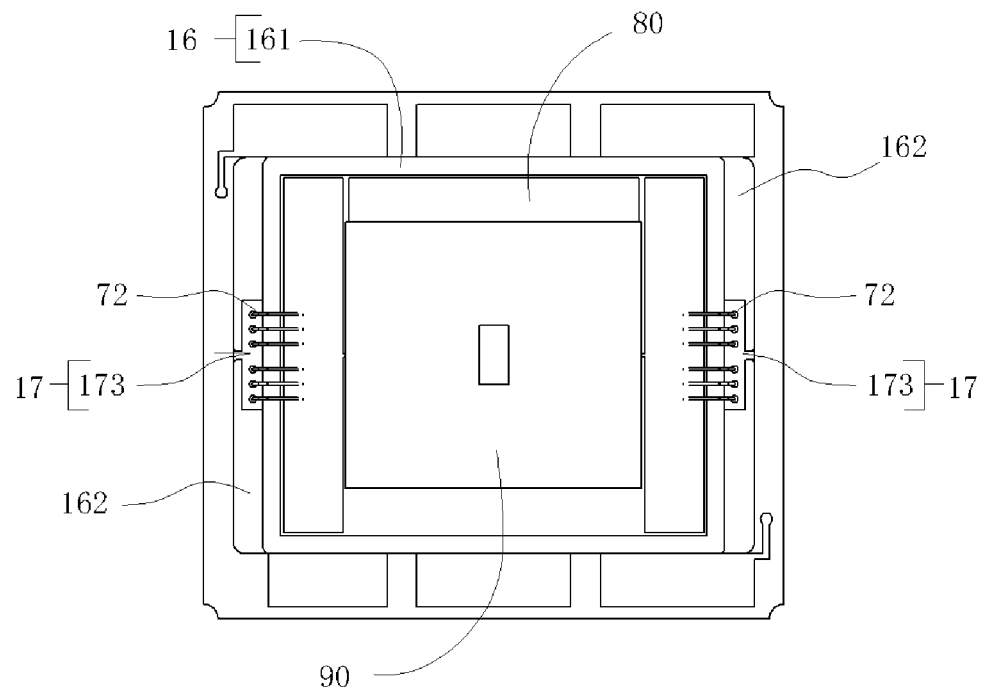
FIG. 5 is a schematic top view corresponding to FIG. 4.
Figure 6:
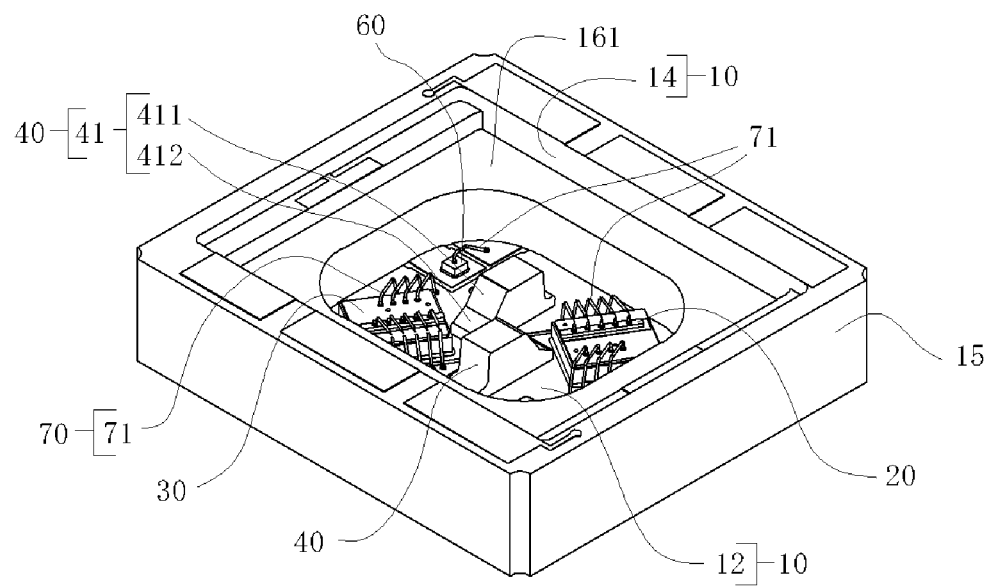
FIG. 6 is a schematic perspective view for describing the internal configuration of the light emitting device according to the first embodiment.
Figure 7:
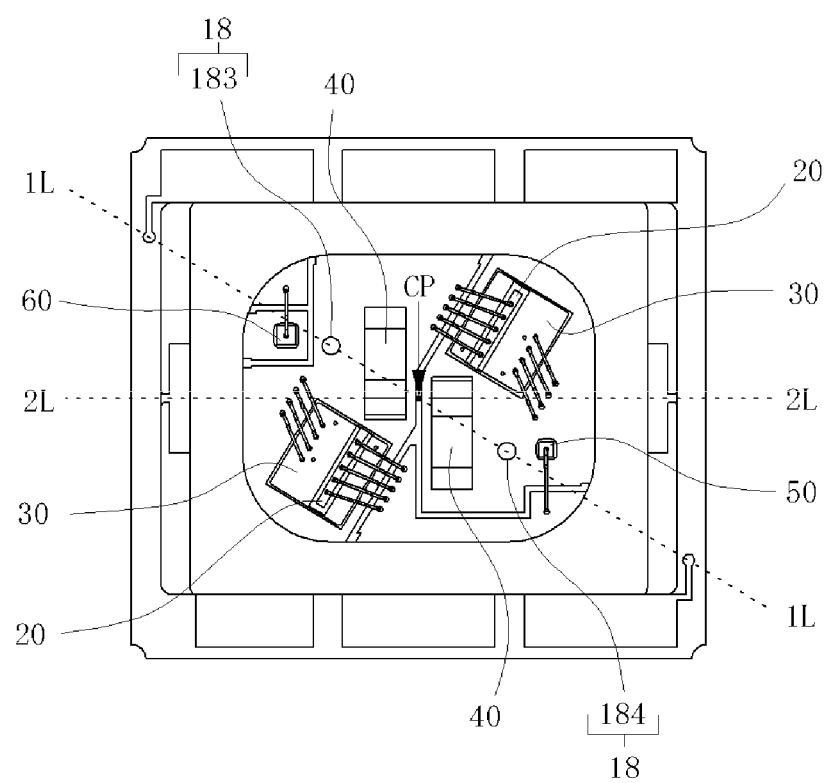
FIG. 7 is a schematic top view corresponding to FIG. 6.
Figure 8:
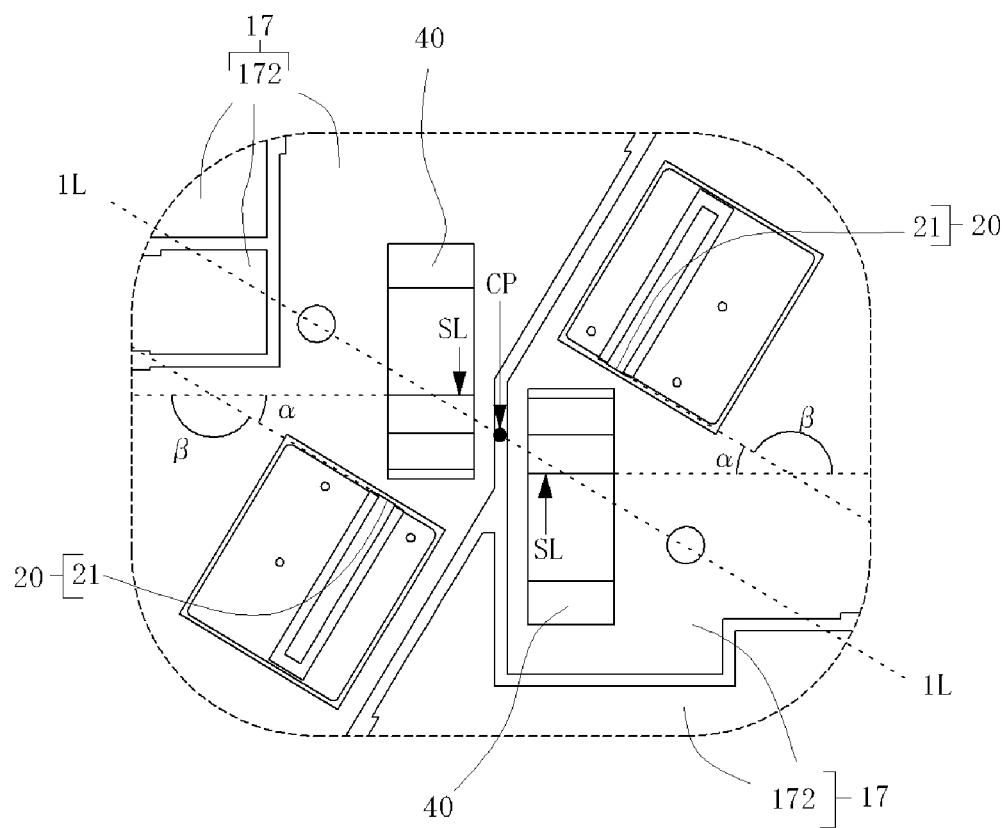
FIG. 8 is an enlarged partial schematic top view of an upward-facing surface (a disposition surface) of a base member with reference to FIG. 7.
Figure 9:
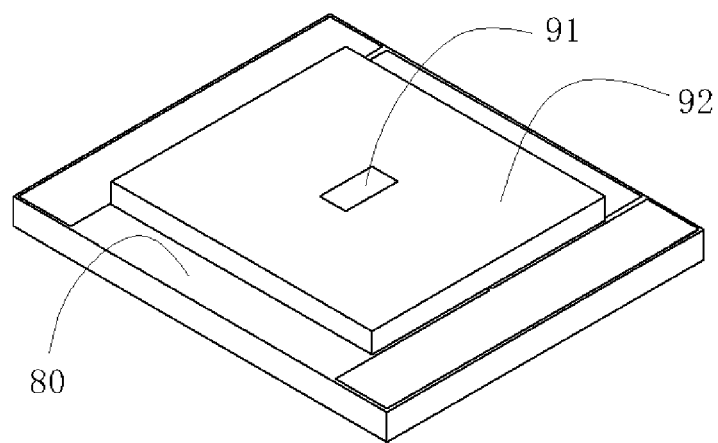
FIG. 9 is a schematic perspective view of a light-transmissive member and a wavelength conversion member bonded to each other according to the first embodiment.
Figure 10:
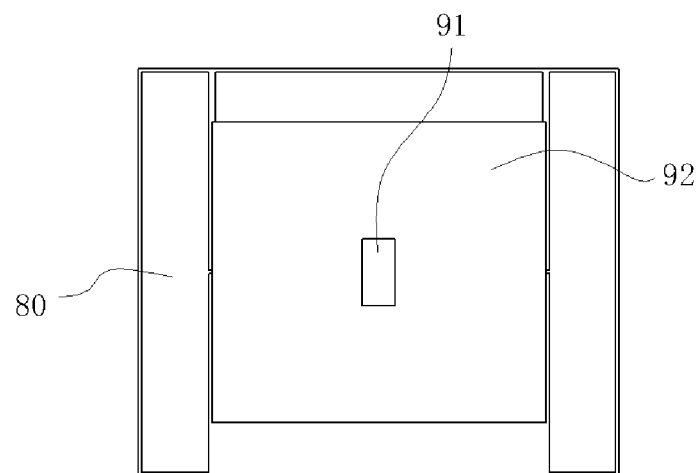
FIG. 10 is a schematic top view corresponding to FIG. 9.
Figure 11:
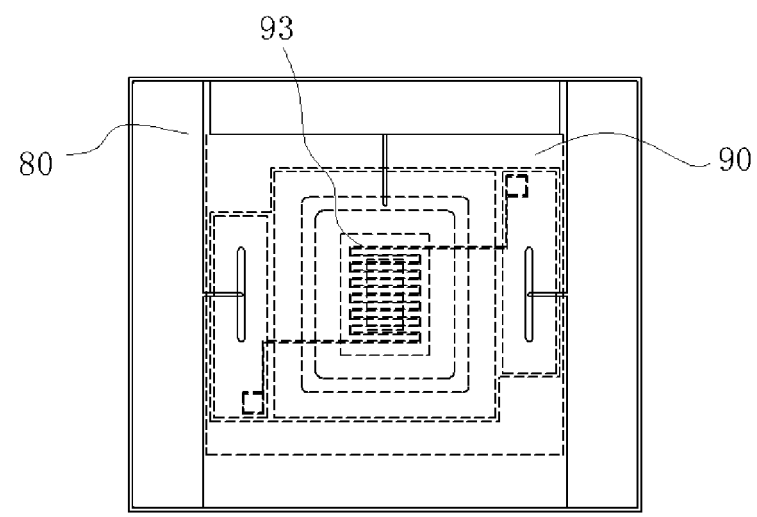
FIG. 11 is a schematic top view in which the wavelength conversion member is shown in a transparent manner for describing the bonding surface between the light-transmissive member and the wavelength conversion member according to the first embodiment.
Figure 12:
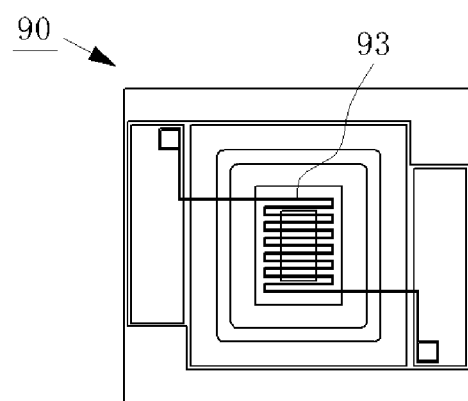
FIG. 12 is a schematic bottom view of the wavelength conversion member according to the first embodiment.

FIG. 1 is a schematic perspective view of the light emitting device 1 according to the first embodiment. FIG. 2 is a top view of the light emitting device 1 corresponding to FIG. 1. FIG. 3 is a cross-sectional view of the light emitting device 1 taken along line III-III in FIG. 2. FIG. 4 is a schematic perspective view of the light emitting device 1 in which illustration of a light-shielding member 100 is omitted for describing the internal configuration of the light emitting device 1. FIG. 5 is a schematic top view corresponding to FIG. 4. FIG. 6 is a schematic perspective view of the light emitting device 1 in which illustration of a light-shielding member 100, the light-transmissive member, and a wavelength conversion member are omitted for describing the internal configuration. FIG. 7 is a schematic top view corresponding to FIG. 6. FIG. 8 is a schematic top view of an upward-facing surface 12 (a disposition surface) of a base member 10 in an enlarged manner with reference to FIG. 7. FIG. 8 does not show some elements so as to clarify the positional relationship between semiconductor laser elements 20 and light-reflective members 40. FIG. 9 is a schematic perspective view of a light-transmissive member 80 and a wavelength conversion member 90 being bonded to each other. FIG. 10 is a schematic top view corresponding to FIG. 9. FIG. 11 is a schematic top view in which the wavelength conversion member 90 is shown in a transparent manner for describing the bonding surface between the light-transmissive member 80 and the wavelength conversion member 90. FIG. 12 is a schematic bottom view of the wavelength conversion member 90 according to the first embodiment.

The light emitting device 1 includes a base member 10, two semiconductor laser elements 20, two submounts 30, two light-reflective members 40, a protective element 50, a temperature measuring element 60, wirings 70, a light-transmissive member 80, a wavelength conversion member 90, and a light-shielding member 100.

The base member 10 has a recessed shape recessed from an upper surface of the base member 10 toward a lower surface of the base member 10. In a top view, the base member 10 has a rectangular outer shape, and the recess is formed inward of a periphery of the base member 10 forming the outer shape of the base member 10. The base member 10 includes an upper surface 11, an upward-facing surface 12, a lower surface 13, inner lateral surfaces 14, and outer lateral surfaces 15. The inner lateral surfaces 14 and the upward-facing surface 12 form the recess. In a top view, the rectangular outer shape is formed by the outer lateral surfaces 15 which intersect with the upper surface 11. In a top view, a rectangular frame is defined by the inner lateral surfaces 14, which intersect with the upper surface 11. The frame surrounds the recess.

The four sides forming the quadrangular outer shape in a top view (the outer lateral surface 15) are parallel to respective closest ones of the four sides forming the rectangular frame in a top view (the inner lateral surfaces 14 in a top view). In the present specification, a distance between each of sides corresponding to the outer shape and a corresponding one of sides corresponding to the frame may refer to a distance between their respective midpoints. That is, in a combination of a single side of the outer shape and a single side of the frame with the smallest distance between their respective midpoints, the single side of the outer shape and the midpoint of the single side of the frame are in parallel. As used herein, the expression "parallel" encompasses a deviation of 5 degrees or less from strictly parallel configuration.

The base member 10 includes at least two stepwise portions 16 located inward of the frame. Each of the stepwise portions 16 includes an upper surface and a lateral surface which intersects with the upper surface and extends downward. Accordingly, the inner lateral surfaces 14 of the base member 10 include lateral surfaces intersecting with the upper surface 11 of the base member 10 and the lateral surfaces of the stepwise portions.

As used herein, the two stepwise portions 16 are referred to as a first stepwise portion 161 and second stepwise portion 162 in sequence from an upward-facing surface 12 side. The base member 10 may include any appropriate number, other than two, of stepwise portions 16. For example, the base member 10 may include a single stepwise portion 16.

Intersection between two surfaces can be understood from the drawings. For example, the outer lateral surfaces 15 may be regarded as intersecting with the upper surface 11 and the lower surface 13. Also, for example, the upper surface of the first stepwise portion 161 can be regarded as intersecting with the lateral surfaces of the second stepwise portions 162, which are lateral surfaces of the base member 10 extending upward from the upper surface of the first stepwise portion 161, at corresponding edges of the first stepwise portion 161, and intersecting with lateral surfaces of base member 10 intersecting with the upper surface 11 at other corresponding edges of the first stepwise portion 161. This is similar for intersection between sides of the base member 10.

A ceramic may be used for a main material of the base member 10. Examples of the ceramic include aluminum nitride, silicon nitride, aluminum oxide, and silicon carbide. Any appropriate insulating material other than ceramic, may be employed as the main material of the base member 10.

The base member 10 is provided with a plurality of metal films 17. The upper surface 11 of the base member 10 is provided with six metal films 171, the upward-facing surface 12 is provided with five metal films 172, and the upper surfaces of the second stepwise portions 162 are provided with two metal films 173. The four metal films 172 on the upward-facing surface 12 and the two metal films 173 on the upper surfaces of the second stepwise portions 162 are connected to respective ones of the six metal films 171 on the upper surface 11 via metal members passing inside the base member 10. The upper surface of the first stepwise portion 161 is also provided with a metal film.

In one example, on the upper surface 11, three metal films 171 are provided to a region corresponding to a side of the upper surface 11 in a top view. As used herein, the expression "a region corresponding to a side of the upper surface 11" refers to a region between a side of the outer shape of the base member 10 and a closest one of the sides of the frame, as described above. Further, a region between the two sides refers to a region in which any straight line connecting any point on one of the two sides and any point on the other of the two side can be located. The upper surface 11 includes regions corresponding to two opposite sides of the upper surface 11, each of which is a region between a corresponding one of two opposite sides of the outer shape of the base member 10 and a closest one of the sides of the frame. The three metal films 171 are provided for each of the regions corresponding to two opposite sides of the upper surface 11. These three metal films 171 are arranged adjacent to one another.

As used herein, a region corresponding to one of two sides of the upper surface 11 at each of which the three metal films 171 are disposed is referred to as a "first region 111", one of two regions corresponding to two sides intersecting with the first region 111 is referred to as a "second region 112", and a region corresponding to the other of the two sides of the upper surface 11 at each of which the three metal films 171 are disposed is referred to as a "third region 113", and one of two regions corresponding to two sides intersecting with the third region 113 and being other than the second region 112 is referred to as a "fourth region 114". In FIG. 2, the first to fourth regions 111 to 114 are hatched.

One of the three metal films 171 disposed on the first region 111 includes a portion extending from the first region 111 to the second region 112. One of the three metal films 171 disposed on the third region 113 includes a portion extending from the third region 113 to the fourth region 114. The portion of the metal film 171 extending to the second region 112 forms an alignment mark 18 in the second region 112. The portion of the metal film 171 extending to the fourth region 114 forms an alignment mark 18 in the fourth region 114. As used herein, the alignment mark 18 in the second region 112 is referred to as a "first alignment mark 181", and the alignment mark 18 in the fourth region 114 is referred to as a "second alignment mark 182".

Alternatively, an alignment mark 18 connected to none of the three metal films 171 arranged adjacent to one another may be employed. That is, an alignment mark separated from the three metal films 171 may be employed. The alignment marks may be formed using any appropriate method other than providing the metal films.

In a top view, the first alignment mark 181 is located between a straight line that includes the side corresponding to the frame (the inner lateral surface 14) in the first region 111, and a straight line parallel to the straight line that includes the side corresponding to the frame in the first region 111 and passing through a midpoint of the side corresponding to the frame (the inner lateral surface 14) in the second region 112. In a top view, the second alignment mark 182 is located between a straight line that includes the side corresponding to the frame (the inner lateral surface 14) in the third region 113, and a straight line parallel to the straight line that includes the side corresponding to the frame in the in the third region 113 and passing through a midpoint of the side corresponding to the frame (the inner lateral surface 14) in the fourth region 114.

In a top view, a straight line connecting the first alignment mark 181 and the second alignment mark 182 is not perpendicular or parallel to any of the four sides of the outer shape of the base member 10. The straight line connecting the first alignment mark 181 and the second alignment mark 182 is not perpendicular or parallel to any of the four sides of the frame. The straight line connecting the first alignment mark 181 and the second alignment mark 182 is inclined at an angle of 10 degrees or more relative to each of the four sides of the frame. That is, the straight line connecting the first alignment mark 181 and the second alignment mark 182 is oblique relative to each of the four sides of the outer shape or the frame of the base member 10.

As seen in FIG. 7, two alignment marks 18 are located on the upward-facing surface 12 of the base member 10. Each of the two metal films 172 is provided with a respective one of the two alignment marks 18 located on the upward-facing surface 12 of the base member 10. The two alignment marks 18 on the upward-facing surface 12 of the base member 10 are referred to as a "third alignment mark 183" and a "fourth alignment mark 184".

In a top view, a line connecting the third alignment mark 183 and the fourth alignment mark 184 is not perpendicular or parallel to any of the four sides of the outer shape of the base member 10. The line connecting the third alignment mark 183 and the fourth alignment mark 184 is not perpendicular or parallel to any of the four sides of the frame. The line connecting the third alignment mark 183 and the fourth alignment mark 184 is inclined at an angle of 10 degrees or more relative to any of the four sides of the frame. The line connecting the third alignment mark 183 and the fourth alignment mark 184 overlaps with the line connecting the first alignment mark 181 and the second alignment mark 182. As used herein, the expression "overlapping" encompasses a deviation of 4 degrees or less about the intersection.

Any other appropriate numbers of the metal films 17 may be employed, and the metal films 17 may be located on any other appropriate regions. The number of the metal films provided to the upper surface 11 or the upward-facing surface 12 may be different from that in the description above. For example, at the upper surface 11, each of the regions corresponding to two opposite sides of the upper surface 11 may be provided with two metal films or a single metal film. In the light emitting device 1, a plurality of metal films are disposed on the upward-facing surface 12 of the base member 10, the upper surface of the second stepwise portion 162, and the upper surface 11 of the base member 10.

Each semiconductor laser element 20 has a rectangular outer shape in a top view. A lateral surface of each semiconductor laser element 20 intersecting with one of two short sides of the rectangle functions as an emission end surface 21 from which light emitted from the semiconductor laser element 20 is emitted. The upper surface and the lower surface of the semiconductor laser element 20 are has an area greater than an area of the emission end surface 21.

Light (laser light) emitted from each semiconductor laser element spreads to form an oval far-field pattern (hereinafter referred to as "the FFP") in a plane parallel to the light emission end surface. The FFP is a shape and intensity distribution of emitted light at a position spaced apart from the emission end surface.

The FFP of light emitted from each semiconductor laser element 20 has an oval shape, which is shorter in a layer direction along each of a plurality of semiconductor layers including an active layer than in a layered direction, in which the plurality of semiconductor layers are layered, perpendicular to the layer direction. The layer direction may be referred to as an "FFP parallel direction", and the layered direction may be referred to as an "FFP perpendicular direction".

In the present specification, according to the light intensity distribution of the FFP of each semiconductor laser element 20, a portion of emitted light having an intensity is $1/e^2$ or more with respect to the peak light intensity is referred to as a "main portion of emitted light". The angle corresponding to the full width at half maximum in the light intensity distribution is referred to as a "divergence". The divergence in the FFP perpendicular direction is referred to as a "perpendicular-direction divergence", and the divergence in the FFP horizontal direction is referred to as a "horizontal-direction divergence".

For the semiconductor laser elements 20, for example, semiconductor laser elements configured to emit blue light can be employed. As used herein, the "blue light" refers to light having peak emission wavelength in a range of 420 nm to 494 nm. Examples of the semiconductor laser elements configured to emit blue light include semiconductor laser elements containing a nitride semiconductor. Examples of the nitride semiconductor include GaN, InGaN, and AlGaN.

Each submount 30 has a rectangular prism-shape, and includes a lower surface, an upper surface, and lateral surfaces. Of lengths of each submount 30, a length of each submount 30 in the upper-lower direction is the smallest. Each submount 30 may have any appropriate shape other than a rectangular prism. The submounts 30 are formed of, for example, silicon nitride, aluminum nitride, or silicon carbide. Any other material may be employed for the submounts 30. A metal film is disposed on the upper surface of each submount 30.

As shown in FIG. 6, each light-reflective member 40 includes two light-reflective surfaces 41 configured to reflect light. Each light-reflective surface includes a plane having a light reflectance of 99% or more for the peak wavelength of light irradiated to the plane. The light reflectance may be 100% or less or less than 100%.

The two light-reflective surfaces 41 have a flat shape, and are inclined relative to the lower surface of the light-reflective member 40 at different inclination angles. That is, the two light-reflective surfaces 41 are not perpendicular or parallel relative to the lower surface of the light-reflective member 40. The two light-reflective surfaces 41 are continuous to each other, to form a single integrated reflective region.

In the present specification, of the two light-reflective surfaces 41, the light-reflective surface closer to the lower surface of the light-reflective member 40 is referred to as a "first reflective surface 411", and the light-reflective surface farther from the lower surface of the light-reflective member 40 is referred to as a "second reflective surface 412". In each light-reflective member 40, the second reflective surface 412 has an inclination angle greater than an inclination angle of the first reflective surface 411 relative to the lower surface of the light-reflective member 40. For example, the difference in inclination angle between the first reflective surface 411 and the second reflective surface 412 is in a range of 10 degrees to 60 degrees.

Alternatively, each light-reflective member 40 may include three or more light-reflective surfaces 41 which form a single integrated reflective region may be provided. Alternatively, a single light-reflective surface 41 may form a single reflective region. Each light-reflective member 40 may include light-reflective surfaces that are not continuous. The shape of the light-reflective surface 41 may be curved instead of being flat.

For a main material of the light-reflective members 40 which forms the outer shape of the light-reflective members 40, a glass, a metal, etc., can be employed. The main material of the light-reflective members 40 is preferably heat resistant, and for example, quartz or glass such as BK7 (borosilicate glass), a metal such as aluminum, or Si can be used. For the light-reflective surfaces, for example, a metal such as Ag or Al, or a dielectric multilayer film such as $Ta_2O_5/SiO_2$, $TiO_2/SiO_2$, or $Nb_2O_5/SiO_2$.

The protective element 50 is for preventing breakdown of specific elements (for example, the semiconductor laser elements). Examples of the protective element 50 include a Zener diode for which Si is used.

A temperature measuring element 60 is used as a temperature sensor for measuring a surrounding temperature. Examples of the temperature measuring element 60 include a thermistor.

The wirings 70 are used to establish electrical connection of some elements (for example, the semiconductor laser elements). Examples of the wirings 70 include metal wires.

The light-transmissive member 80 has a flat rectangular prism-shape, and includes a lower surface, an upper surface, and lateral surfaces. The light-transmissive member is light transmissive, that is, transmits light. As used herein, the expression "light transmissive" refers to having a light transmittance of 80% or more. The light-transmissive member 80 may have any appropriate shape other than a rectangular prism-shape.

For a main material of the light-transmissive member 80, sapphire can be used. Sapphire has a relatively high refractive index and also has a great strength. Examples of the main material other than sapphire include, quartz, silicon carbide, and glass.

Two metal films are disposed on an upper surface of the light-transmissive member 80. A metal film is disposed on a lower surface of the light-transmissive member 80. A peripheral region of each of the upper surface and the lower surface of the light-transmissive member 80 is provided with respective one or more metal films. Accordingly, the light-transmissive member 80 includes a light-transmissive region and a non-transmissive region in a top view or a bottom view. Further, the light-transmissive member 80 includes a light-transmissive region is provided at a center portion of the light-transmissive member 80.

The wavelength conversion member 90 has a flat rectangular prism-shape, and includes a lower surface, an upper surface, and lateral surfaces. The wavelength conversion member 90 includes a light-transmissive wavelength conversion part 91, and a surrounding part 92. The wavelength conversion part 91 and the surrounding part 92 are integrally formed. The inner lateral surfaces of the surrounding part 92 are in contact with the lateral surfaces of the wavelength conversion part 91. The outer lateral surfaces of the surrounding part 92 correspond to the lateral surfaces of the wavelength conversion member 90.

The wavelength conversion part 91 has a rectangular prism-shape. The wavelength conversion part 91 is configured to convert light incident on the wavelength conversion part 91 into light of a different wavelength. For a main material of the wavelength conversion member 90, an inorganic material that is less prone to be decomposed by irradiation with light can be used. The main material of the wavelength conversion member 90 may not be an inorganic material.

The wavelength conversion part 91 may contain ceramic as the main material of the wavelength conversion part 91, and a fluorescent material. Other appropriate configuration may be employed for the wavelength conversion part 91. For example, the main material of the wavelength conversion part 91 may be glass, or a nanocrystal of a fluorescent material. In consideration of heat generated in the wavelength conversion part 91, a material having a melting point in a range of 1300° C. to 2500° C. is preferably used for a main material of the wavelength conversion part 91.

For example, when a ceramic is employed as a main material of the wavelength conversion part 91, the ceramic may be obtained by sintering a fluorescent material and a light-transmissive material such as aluminum oxide. The content of the fluorescent material may be in a range of 0.05 volume percent to 50 volume percent with respect to the total volume of ceramic. Alternatively, the ceramic may be obtained by sintering powder of a fluorescent material, that is, ceramic formed of substantially just the fluorescent material.

Examples of the fluorescent material include a cerium-activated yttrium-aluminum-garnet-based fluorescent material (YAG), a cerium-activated lutetium-aluminum-garnet-based fluorescent material (LAG), a europium and/or chromium-activated nitrogen-containing calcium aluminosilicate-based fluorescent material ($CaO$—$Al_2O_3$—$SiO_2$), a europium-activated silicate-based fluorescent material ((Sr, Ba)$_2$SiO$_4$), an α-sialon fluorescent material, a β-sialon fluorescent material, and the like. Among these, a YAG fluorescent material, having good heat resistance, is preferably used.

The surrounding part 92 has a flat rectangle prism-shape defining a through hole at a center of the flat rectangle prism-shape. The wavelength conversion part 91 is disposed in the through hole. The shape of the through hole corresponds to the shape of the wavelength conversion part 91. The surrounding part 92 surrounds the lateral surfaces of the wavelength conversion part 91.

A ceramic may be used for a main material of the surrounding part 92. Materials other than a ceramic, such as a metal or a complex of ceramic and metal, may be employed for the surrounding part 92. For the surrounding part 92, a material with a highly thermal conductivity configured to dissipate heat generated in the wavelength conversion part 91 is preferably used. When a material with a highly thermal conductivity is employed for a main material of the surrounding part 92, the surrounding part 92 has a heat dissipating function of dissipating heat in the wavelength conversion part 91. In view of this, the surrounding part 92 may be regarded as a heat dissipating member.

For the surrounding part 92, a material having a high reflectance for light emitted from the semiconductor laser elements 20 and a high reflectance for fluorescent emitted by the fluorescent material. When a material with a highly thermal conductivity is employed for a main material of the surrounding part 92, the surrounding part 92 reflects light irradiated to the surrounding part 92 at a high reflectance. In this context, the surrounding part 92 can be regarded as a light-reflective member. Examples of a material with high reflectance and high thermal conductivity include alumina ($Al_2O_3$) ceramic.

A conductive film is disposed on a lower surface of the surrounding part 92. The conductive film has a linear shape, and overlaps with the wavelength conversion part 91 in a bottom view. Two opposite ends of the linear conductive film are connected to the metal films disposed on the lower surface of the surrounding part 92. The two opposite ends of the linear conductive film are connected to respective metal films different from each other. The opposite ends of the linear conductive film may be located in the vicinity of the wavelength conversion part 91 instead of overlapping with the wavelength conversion part 91.

The conductive film preferably has a narrow linear shape. The expression "narrow linear shape" as used herein refers to, for example, a length of a portion of the conductive film having a width smaller than a width of the wavelength conversion part 91 in a bottom view is longer than the outer periphery of the wavelength conversion part 91. As used herein, the expression "width of the wavelength conversion part 91," refers to, for example, when the outer shape of the wavelength conversion part 91 is a quadrangular shape, the width of the short side of the wavelength conversion part 91. When the outer shape of the wavelength conversion part 91 is an oval shape, the expression "width of the wavelength conversion part 91" as used herein refers to the width of the minor axis of the wavelength conversion part 91. When the outer shape of the wavelength conversion part 91 is a shape other than these shapes, the width of the shape is appropriately determined according to these examples.

The wavelength conversion member 90 may be obtained by, for example, integrally molding the wavelength conversion part 91, which is made of a molded body such as a sintered body, and a powder material that is to form the surrounding part 92 and sintering the wavelength conversion part 91 and the powder material that are integrally molded. Alternatively, the wavelength conversion member 90 may be obtained by, for example, integrally molding the surrounding part 92, which is a molded body such as a sintered body, and a powder material that is to form the wavelength conversion part 91, and sintering the surrounding part 92 and the powder material that are integrally molded. For the sintering, for example, spark plasma sintering (SPS) or hot pressing (HP) can be employed.

For the conductive film, indium tin oxide (ITO) can be used. ITO has a high transmittance for visible light. The conductive film formed of ITO is light transmissive, and accordingly can be regarded as a light-transmissive conductive film.

The light-shielding member 100 defines a through hole at a center portion of the light-shielding member 100. At a lower surface side of the light-shielding member 100, the light-shielding member 100 has a projection surrounding the through hole. In other words, the light-shielding member 100 has a recessed shape recessed at the center portion at the lower surface side.

The light-shielding member 100 is made of a light-shielding resin. As used herein, the expression "light-shielding" refers to the property of not transmitting light. The light-shielding property may be achieved by, in addition to the light shielding characteristic, the light-absorbing characteristic or the light-reflective characteristic. For example, the light-shielding property may be achieved by resin containing filler of a light diffusing member and/or a light absorbing member.

Examples of the resin forming the light-shielding member 100 include epoxy resin, silicone resin, acrylate resin, urethane resin, phenolic resin, and BT resin. Examples of the light-absorbing filler include a dark-color pigment such as carbon black.

Next, a description will be given of the procedure of manufacturing the light emitting device 1 with the elements described above. Two light-reflective members 40 are disposed on the upward-facing surface 12 of the base member 10. Accordingly, the upward-facing surface 12 of the base member 10 can be regarded as the disposition surface on which the light-reflective members 40 are disposed. Each of the two light-reflective members 40 is disposed on a respective one of different metal films 172, and respective lower surfaces the light-reflective members 40 are bonded to the upward-facing surface 12 of the base member 10. Disposing position of the light-reflective members 40 is determined according to the alignment marks 18 and reference lines SL for the light-reflective members 40.

The "reference lines SL for the light-reflective members 40" as used herein refer to lines serving as the aligning reference when disposing the light-reflective members 40. The reference line SL may be located at a predetermined region of the corresponding light-reflective member 40, or may be determined according to configuration of the predetermined region of the corresponding light-reflective member 40. That is, the reference lines SL can be obtained according to the predetermined regions of respective light-reflective members 40.

In the light emitting device 1, in a top view, a straight line passing through a side corresponding the upper edge of the light-reflective surface 41 serves as the reference line SL for the light-reflective member 40. Other lines may be employed for the reference line. For example, a line passing through a side corresponding to the lower edge of the light-reflective surface 41 may serve as the reference line. Alternatively, for example, when the upper surface of the light-reflective member 40 has a rectangular shape, with two apexes of the rectangular upper surface of the light-reflective member 40 serving as characteristic points, a line passing through the two characteristic points may serve as the reference line.

Each light-reflective member 40 is disposed such that the reference line SL is parallel to a line rotated at a predetermined angle with respect to a line passing through the first alignment mark 181 and the second alignment mark 182 in a top view (i.e., the reference line SL is parallel to a line that is oblique to a light passing through the first alignment mark 181 and the second alignment mark 182 at a predetermined angle). As used herein, the line passing through a pair of alignment marks is referred to as a "first line 1L", and the line rotated at a predetermined angle relative to the first line 1L is referred to as a "second line 2L". The pair of alignment marks is the first alignment mark 181 and the second alignment mark 182.

The two light-reflective members 40 are point-symmetrically disposed. The two light-reflective members 40 are symmetrically disposed relative to the midpoint CP of the line between (connecting) the first alignment mark 181 and the second alignment mark 182.

More specifically, using a mounter, the midpoint CP is determined according to the first alignment mark 181 and the second alignment mark 182, and the second line 2L is determined to be rotated relative to the first line 1L at a predetermined angle about the midpoint CP. In a top view, according to an XY plane with the second line 2L in an X direction, a direction perpendicular to the second line 2L in a Y direction, and the midpoint CP at coordinates of (0, 0), the two light-reflective members 40 are disposed such that the reference lines SL are parallel to the second line 2L and the two light-reflective members 40 are point-symmetrical about the coordinates (0, 0).

In a top view, the second line 2L is parallel to the side corresponding to the frame (the inner lateral surface 14) in the first region 111 or the third region 113. The second line 2L is perpendicular to the side corresponding to the frame (the inner lateral surface 14) in the second region 112 or the fourth region 114. As used herein, "parallel" and "perpendicular" encompass configurations with a deviation of 6 degrees or less from strictly parallel configuration and strictly perpendicular configuration.

That is, the predetermined angle with respect to the first line 1L is determined according to an angle defined by the first line 1L and a line passing through a side corresponding to the frame of the base member 10 as designed. The predetermined angle may be set such that the second line 2L is oblique with respect to a side of the frame of the base member 10 instead of being parallel or perpendicular.

The first line 1L may be the line passing through the third alignment mark 183 and the fourth alignment mark 184. Alternatively, the first line 1L may be a line passing through any two alignment marks 18, or three or more alignment marks 18. Accordingly, the first line 1L may be regarded as a line determined according to a plurality of alignment marks 18.

The two light-reflective members 40 may be disposed to be symmetrical relative to the midpoint CP of the line connecting the third alignment mark 183 and the fourth alignment mark 184.

In a top view, the two light-reflective members 40 do not overlap with the third alignment mark 183 and the fourth alignment mark 184. Accordingly, at this time, the third alignment mark 183 and the fourth alignment mark 184 can be visually recognized from an upper surface side.

Next, the protective element 50 and the temperature measuring element 60 are disposed on the upward-facing surface 12 of the base member 10. The protective element 50 is disposed and bonded onto a metal film 172 on which one of the two light-reflective members 40 is disposed. The temperature measuring element 60 is disposed and bonded onto another metal film 172 which is different from the metal films 172 on each of which a respective one of the two light-reflective members 40 is disposed.

Next, the two submounts 30 are disposed on the upward-facing surface 12 of the base member 10. In a top view, the submounts 30 are disposed such that corresponding one or more sides of the upper surface are parallel to the first line. Each of the two submounts 30 is disposed on a respective one of different metal films 172, and respective lower surfaces of the submounts 30 are bonded to the upward-facing surface 12 of the base member 10. Each of the two submounts 30 is disposed on a respective one of the metal films 172 on each of which the light-reflective members 40 is disposed.

Each submount 30 and a corresponding light-reflective member 40 may be disposed on different metal films 172. In a top view, the two submounts 30 do not overlap with the third alignment mark 183 and the fourth alignment mark 184. Accordingly, at this time, the third alignment mark 183 and the fourth alignment mark 184 can be visually recognized from the upper surface side.

Next, the semiconductor laser elements 20 are disposed on the submounts 30. Each of the two semiconductor laser elements 20 is disposed on the upper surface of a respective one of different submounts 30, and the lower surface of each of the two semiconductor laser elements 20 is bonded to the upper surface of a respective one of the submounts 30. The disposing positions of the semiconductor laser elements 20 are determined according to the alignment marks 18 and the light emission end surfaces 21 of the semiconductor laser elements 20.

Each semiconductor laser element 20 is disposed such that the emission end surface 21 is parallel to the first line 1L in a top view. The two semiconductor laser elements 20 are point-symmetrically disposed. The two semiconductor laser elements 20 are disposed to be symmetrical relative to the midpoint CP of the line connecting the first alignment mark 181 and the second alignment mark 182.

More specifically, using the mounter, the first line 1L is determined according to the first alignment mark 181 and the second alignment mark 182, and the midpoint CP is determined. In a top view, according to an XY plane with the first line 1L in an X direction, a direction perpendicular to the first line 1L in a Y direction, and the midpoint CP at coordinates of (0, 0), the two semiconductor laser elements 20 are disposed such that emission end surfaces are parallel to the first line 1L and the two semiconductor laser elements 20 are point-symmetrical about the coordinates (0, 0).

Thus, the two semiconductor laser elements 20 and the two light-reflective members 40 are disposed to be symmetrical about the same point. The two semiconductor laser elements 20 may be disposed to be symmetrical relative to the midpoint CP of the line connecting the third alignment mark 183 and the fourth alignment mark 184.

In a top view, the two semiconductor laser elements 20 do not overlap with the third alignment mark 183 and the fourth alignment mark 184. Accordingly, at this time, the third alignment mark 183 and the fourth alignment mark 184 can be visually recognized from the upper surface side.

The emission end surface 21 of each of the two semiconductor laser elements 20 is not parallel or perpendicular to a corresponding one of the inner lateral surfaces 14 or a corresponding one of the outer lateral surfaces 15 of the base member 10 in a top view. Accordingly, each of the emission end surfaces 21 is not parallel or perpendicular to the upper edge of a corresponding one of the light-reflective surfaces 41. That is, the semiconductor laser elements 20 are disposed such that their respective emission end surfaces 21 are oblique relative to respective ones of the inner lateral surfaces 14 and respective ones of the outer lateral surfaces 15 of the base member 10 or to the upper edges of the light-reflective surfaces 41 in a top view.

In the light emitting device 1, for each of the semiconductor laser elements 20, the oblique angle defined by a line including the emission end surface 21 of each semiconductor laser element 20 and a line including the upper end of corresponding light-reflective surface 41 is in a range of 25 degrees to 35 degrees in a top view. The oblique angle defined by the line including the emission end surface 21 and the line including the upper end of a corresponding light-reflective surface 41 is indicated by the angle α in FIG. 8, and not the angle β. The oblique angle defined by the line including the emission end surface 21 and the line including the upper end of a corresponding light-reflective surface 41 may be in a range of 10 degrees to 80 degrees. In consideration of irradiation of light on the light-reflective members 40, the oblique angle is preferably designed to be 45 or less.

The light emitted from the emission end surface 21 of each of the two semiconductor laser elements 20 is irradiated to a corresponding light-reflective member 40. The expression "corresponding light-reflective member 40" refers to the light-reflective member 40 disposed on the same metal film. Each semiconductor laser element 20 is disposed so that at least the main portion light is irradiated on the corresponding light-reflective surface 41.

Mounting using the first line 1L determined directly from the alignment marks 18 can be performed more precisely than mounting using the second line 2L rotated with respect to the first line 1L about the midpoint CP. Accordingly, when mounting each semiconductor laser element 20 and a corresponding light-reflective member 40 to be obliquely arranged in a top view, performing the mounting such that the emission end surface 21 is aligned with the first line and the light-reflective member 40 is aligned with the second line allows for precisely setting the propagation direction of light reflected by the light-reflective member 40.

Mounting the light-reflective member 40 to be aligned with the second line rotated with respect to the first line at a predetermined angle in a top view allows for more precisely setting the oblique angle defined by the semiconductor laser element 20 and the light-reflective member 40, than mounting the light-reflective member 40 to be aligned with a predetermined side of the inner lateral surfaces 14 or a predetermined side of the outer lateral surfaces 15 of the base member 10.

In the corresponding pair of each semiconductor laser element 20 and a corresponding light-reflective member 40, the semiconductor laser element 20 is positioned farther from the midpoint CP of the line connecting the first alignment mark 181 and the second alignment mark 182 than the light-reflective member 40. Accordingly, light emitted from the semiconductor laser element 20 propagates in the direction approaching the midpoint CP. At least one of the two semiconductor laser elements 20 is disposed in the vicinity of the temperature measuring element 60. Due to symmetrical arrangement of the two semiconductor laser elements 20, it is considered that there may not exist a large difference in temperature between the two semiconductor laser elements 20.

The submounts 30 on which the semiconductor laser elements 20 are disposed function as heat dissipating members for dissipating heat generated in the semiconductor laser elements 20 in the light emitting device 1. In order for the submounts 30 to function as heat dissipating members, a material with a thermal conductivity greater than the semiconductor laser elements 20 are used for the submounts 30. When a material with a thermal conductivity greater than the upward-facing surface 12 of the base member 10 are used for the submounts 30, greater heat dissipation effect can be exhibited.

The submounts 30 can be used to adjust the emission position of light from the semiconductor laser elements in the light emitting device 1. For example, when irradiating light such that light propagating along the optical axis is parallel to the upward-facing surface 12 and is irradiated to a predetermined position of each light-reflective surface 41, the submounts can be used as adjustment members.

Next, a plurality of wirings 70 are bonded for establishing electric connection with the semiconductor laser elements 20, electric connection with the protective element 50, and electric connection with the temperature measuring element 60. For electrical connection, the metal films 172 provided on the upward-facing surface 12 of the base member 10 are used. Accordingly, the metal films 172 disposed on the upward-facing surface 12 of the base member 10 function as conduction regions for electric connection.

The wirings 70 are bonded so that the two semiconductor laser elements and the protective element 50 are connected in series. Further, the wirings 70 are bonded so that the temperature measuring element 60 is electrically connected separately from the two semiconductor laser elements and the protective element 50.

Some of the wirings 70 include respective first end portions bonded to the upper surface of a corresponding one of the semiconductor laser elements 20, and respective second end portions bonded to a corresponding one of the metal films 172 disposed on the upward-facing surface 12 of the base member 10. Accordingly, the disposing position for bonding the first end portions of corresponding wirings 70 to the upper surfaces of the semiconductor laser elements 20 is determined according to the first line. This allows the corresponding wirings 70 to be precisely bonded to the upper surface of the semiconductor laser elements 20 having narrow width.

Next, the light-transmissive member 80 is disposed on the upper surface of the base member 10. The light-transmissive member 80 is disposed on the upper surface of the stepwise portion 16 of the base member 10, with a lower surface of the light-transmissive member 80 facing an upper surface of the stepwise portion 16. More specifically, the light-transmissive member 80 is bonded to the upper surface of the first stepwise portion 161. The metal films disposed along the peripheral region of the lower surface of the light-transmissive member 80 and the metal film disposed on the upper surface of the first stepwise portion 161 are bonded to be secured to each other via Au—Sn or the like.

Bonding the light-transmissive member 80 to the base member 10 forms a closed space where the semiconductor laser elements 20 are disposed. In this manner, in the light emitting device 1, the light-transmissive member 80 can function as a cover. This closed space is hermetically sealed. The hermetic sealing avoids collection of organic substances or the like at the emission end surfaces of the semiconductor laser elements 20.

In a top view, the light-transmissive member 80 overlaps with the third alignment mark 183 and the fourth alignment mark 184. On the other hand, the light-transmissive member 80 does not overlap with the first alignment mark 181 and the second alignment mark 182. Accordingly, the first alignment mark 181 and the second alignment mark 182 are located outward of the bonding region of the base member 10 where the base member 10 is bonded to the light-transmissive member 80.

The light-transmissive member 80 is bonded to the base member 10 with the wavelength conversion member 90 bonded to its upper surface. That is, the light-transmissive member 80 is disposed on the upper surface of the base member 10, and the wavelength conversion member 90 is disposed on the upper surface of the light-transmissive member 80. Accordingly, the wavelength conversion member 90 is disposed above the semiconductor laser elements 20 and the light-reflective members 40 disposed on the upward-facing surface 12.

Light emitted from the two semiconductor laser elements 20, particularly a main portion of light emitted from each of the two semiconductor laser elements 20, is reflected by respective corresponding light-reflective surfaces 41 of respective corresponding light-reflective members 40, is then transmitted through the light-transmissive member 80, and is incident on the lower surface of the wavelength conversion part 91.

A portion of or the entirety of light incident on the wavelength conversion part 91 is converted into light of a different wavelength by the wavelength conversion part 91. The laser light or the wavelength-converted light is emitted from the upper surface of the wavelength conversion part 91 to the outside of the light emitting device 1. That is, the upper surface of the wavelength conversion part 91 serves as the light extraction surface of the light emitting device 1.

In a top view, the midpoint CP of the line connecting the first alignment mark and the second alignment mark is located in the region where the wavelength conversion part is provided (i.e., the midpoint CP overlaps the wavelength conversion part 91 in a top view). Such arrangement allows light emitted from the two semiconductor laser elements 20 to be effectively incident on the wavelength conversion part 91.

Concentration of heat generated by the wavelength conversion onto a particular portion tends to cause deterioration of the wavelength conversion part 91. Therefore, the distribution of light incident on the wavelength conversion part 91 is preferably diffused. For example, it is preferable that respective high-intensity portions of laser lights emitted from respective ones of the two semiconductor laser elements 20 do not overlap with each other by their high-intensity portions. The light emitting device 1 has a configuration such that light propagating through the optical axis does not pass the center of the wavelength conversion part.

The surrounding part 92 is bonded to the light-transmissive member 80, so that the wavelength conversion member 90 is bonded to the light-transmissive member 80. In the surrounding part 92, the metal film connected to one end of the conductive film and one of the two metal films of the light-transmissive member 80 are bonded to each other; and the metal film connected to other end of the conductive film and the other one of the two metal films are bonded to each other. Thus, electric connection is established with the two metal films of the light-transmissive member 80 functioning as the electrodes.

The conductive film is a narrow linear-shaped film to extending on the lower surface of the wavelength conversion part 91. Accordingly, when an error such as breakage occurs in the wavelength conversion part 91, the conductive film is also cracked according to the shock caused by the error, resulting in a change in the electric connection state. Accordingly, by detecting this change (for example, a large increase in resistance), the error of the wavelength conversion part 91 can be detected. The conductive film is regarded as an error detecting element 93, which is a sensor configured to detect an error of the wavelength conversion part 91.

The upper surface of the light-transmissive member 80 is has a size greater than the lower surface of the wavelength conversion member 90. In a top view, the upper surface of the light-transmissive member 80 surrounds the lower surface of the wavelength conversion member 90. Alternatively, the upper surface of the light-transmissive member 80 surrounds the wavelength conversion member 90. In a top view, the two metal films on the upper surface of the light-transmissive member 80 are provided across the region overlapping with the lower surface of the wavelength conversion member 90 and the region not overlapping with the lower surface of the wavelength conversion member 90.

Next, wirings 70 for electrically connecting the error detecting element 93 are bonded. For establishing the electric connection, the metal films 173, disposed on the second stepwise portions 162 of the base member 10, and the region in the metal film on the light-transmissive member 80 which does not overlap with the lower surface of the wavelength conversion member 90 are used. Accordingly, these metal films function as the conduction regions provided for establishing electrical connection. The wirings 70 for electrically connecting the error detecting element 93 includes respective first end portions bonded to the metal films on the upper surface of the light-transmissive member 80, and respective second end portions bonded to the metal films 173 on the upper surfaces of the second stepwise portions 162.

As used herein, wirings 70 for electrically connecting the semiconductor laser elements 20, the protective element 50, and the temperature measuring element 60 are referred to as "first wirings 71", and o wirings 70 electrically connecting the error detecting element 93 are referred to as "second wirings 72".

The six metal films 171 on the upper surface 11 of the base member 10 consist of two metal films for supplying electricity to the semiconductor laser elements 20, two metal films for supplying electricity to the temperature measuring element 60, and two metal films for supplying electricity to the error detecting element 93. Accordingly, the metal films 171 disposed on the upper surface 11 of the base member 10 function as conduction regions for establishing electrical connection.

Other configurations may be employed for supplying electricity. For example, when the light emitting device 1 does not include the temperature measuring element 60 and the error detecting element 93, the metal films need not include metal films corresponding to these components, or, for example, the corresponding metal films may be used for other purposes.

The metal film 171 which forms the first alignment mark 181 includes a conduction region in the first region 111, and an alignment region for the alignment mark 18 in the second region 112. At least the first alignment mark 181 is not formed in the first region 111.

The metal film 171 which forms the second alignment mark includes a conduction region in the third region 113, and an alignment region for the alignment mark 18 in the fourth region 114. At least the second alignment mark 182 is not formed in the third region 113.

Next, the light-shielding member 100 is formed inward of the frame formed by the upper surface 11 of the base member 10. The light-shielding member 100 is formed to fill the space between the base member 10 and the wavelength conversion member 90. The light-shielding member 100 is formed by pouring resin, and curing the poured resin by applying heat. The resin filling the space allows for obtaining light-shielding property greater than in the case in which the light-shielding member 100 having been molded into a predetermined shape is fitted into the space. The resin does not enter the closed space where the semiconductor laser elements 20 are disposed.

The light-shielding member 100 is in contact with the inner lateral surfaces 14 of the base member 10 intersecting with the upper surface 11, the upper surfaces of the stepwise portions 16 of the base member 10, the lateral surfaces of the light-transmissive member 80, the upper surface of the light-transmissive member 80, and the lateral surfaces of the wavelength conversion member 90. The light-shielding member 100 does not reach the upper surface of the wavelength conversion member 90. Alternatively, the light-shielding member 100 reaches the upper surface of the surrounding part 92 without reaching the upper surface of the wavelength conversion part 91. With this structure, light emitted from the semiconductor laser elements 20 can be inhibited from being leaked from portions other than the wavelength conversion part 91.

The second wirings 72 is embedded in the light-shielding member 100. That is, at the time where the light-shielding member 100 is formed, the second wirings 72 are not exposed outside the light emitting device 1. This allows for protecting the second wirings 72 from moisture or the like. The second wirings 72 is not necessarily embedded in the light-shielding member 100.

The wavelength conversion member 90 penetrates through the through hole formed in the light-shielding member 100. The projecting portion of the projecting shape formed at the lower surface side of the light-shielding member 100 is fitted into the groove between the lateral surface of the light-transmissive member 80 and the inner lateral surface 14 of the base member 10.

The light-shielding member 100 covers the metal region that has been exposed inward of the frame formed by the upper surface 11 of the base member 10 in a top view. In the light emitting device 1, the light-shielding member 100 is made of an insulating material, to function as an insulating member. Thus, the conduction region for supplying electricity to the light emitting device 1 from an external power supply can be limited to be located outside the space defined by the recessed shape.

In a top view, the light-shielding member 100 does not overlap with the first alignment mark 181 and the second alignment mark 182. That is, the light-shielding member 100 does not cover the first alignment mark 181 and the second alignment mark 182.

The light emitting device 1 is manufactured through the steps described above. The light emitting device 1 includes the first alignment mark 181 and the second alignment mark 182 at an outer periphery of the light emitting device 1. Accordingly, when mounting the manufactured light emitting device 1 on other member or the like, the mounting can be carried out precisely using the first alignment mark 181 and the second alignment mark 182.

The third alignment mark 183 and the fourth alignment mark 184 may be used for mounting an element on the upward-facing surface 12 of the base member 10 while using the first alignment mark 181 and the second alignment mark 182 for mounting other element. Depending on the performance of the mounter, the mounting may be further precisely carried out using the alignment marks 18 located in a plane same as the upward-facing surface 12, which is the disposition surface.

Alternatively, the first alignment mark 181 and the second alignment mark 182 may be used in mounting a member not included in the light emitting device 1 while using the third alignment mark 183 and the fourth alignment mark 184 for mounting an element of the light emitting device 1. Any other appropriate use of the alignment marks 18 may be employed. the alignment marks 18 on the upper surface 11 and the alignment marks 18 on the upward-facing surface 12 may be selectively used according to the steps.

The steps described above is merely an example, and the order of the steps may partially be changed. For example, before disposing the light-reflective member 40, the submounts 30 and the semiconductor laser elements 20 may be disposed. Alternatively, for example, the semiconductor laser elements 20 may be disposed on the submounts 30, and thereafter the submounts 30 may be disposed on the upward-facing surface 12. Any other appropriate changes in order of steps can be flexibly made, unless they are apparently non-realizable. The expression "apparently non-realizable order of steps" refers to, for example, forming the closed space with the cover and thereafter disposing the semiconductor laser elements 20 in the closed space.

Second Embodiment

Figure 13:
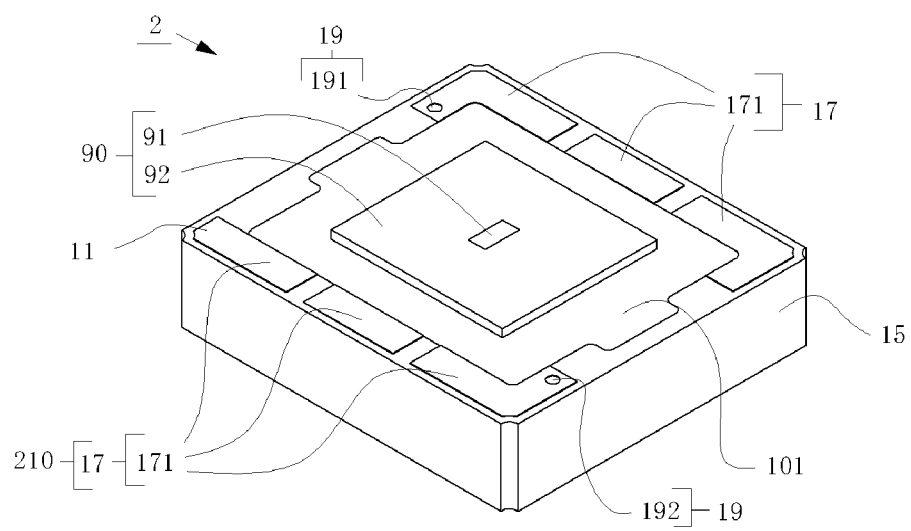
FIG. 13 is a schematic perspective view of a light emitting device according to a second embodiment.
Figure 14:
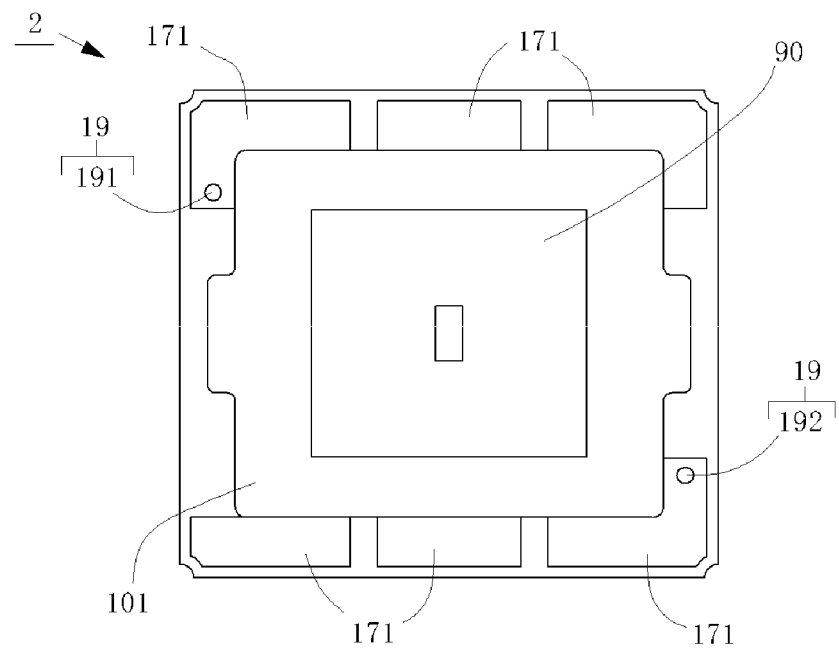
FIG. 14 is a schematic top view of the light emitting device shown in FIG. 13.
Figure 15:
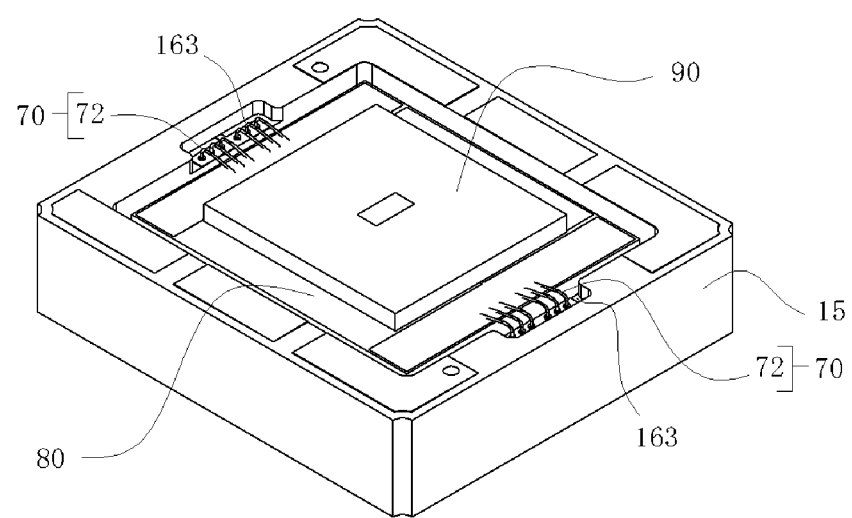
FIG. 15 is a schematic perspective view for describing the internal configuration of the light emitting device according to the second embodiment.

FIG. 13 is a schematic perspective view of a light emitting device 2 according to a second embodiment. FIG. 14 is a schematic top view of the light emitting device 2 corresponding to FIG. 13. FIG. 15 is a schematic perspective view of the light emitting device 2 without a light-shielding member 101 for describing the internal configuration.

The light emitting device 2 according to the second embodiment is different from the light emitting device 1 according to the first embodiment in the shape of the base member and accordingly the shape of the light-shielding member. In the light emitting device 1, each alignment mark is formed by disposing a metal film on a region where the alignment mark is to be positioned. On the other hand, in the light emitting device 2, each alignment mark is formed by disposing a metal film surrounding a region where the alignment mark is to be positioned.

In the base member 10 of the light emitting device 1, the second stepwise portions 162 are formed over the entire length of the sides corresponding to the frame in the second region 112 and the fourth region 114 in a top view. On the other hand, in the base member 210 of the light emitting device 2, second stepwise portions 163 are formed at a portion of the side of the frame in the second region 112 and at a portion of the side of the frame in the fourth region 114 in a top view. The first to fourth regions in the second embodiment are identical to those described in the first embodiment and, therefore, are not denoted by the reference characters in FIGS. 13 to 15.

In a top view, the second stepwise portion 163 is not formed in other part of the side corresponding to the frame in the second region 112, and the second stepwise portion 163 is not formed in other part of the side corresponding to the frame in the fourth region 114. More specifically, in each of the sides corresponding to the frame in the second region 112 and the fourth region, the second stepwise portion 163 is formed at a center portion, and not on portions on both sides of the center portion.

In the portions where the second stepwise portions 163 are not formed, the upper surface of the first stepwise portion 161 intersects with lateral surfaces which intersect with the upper surface 11. Accordingly, each of the second region 112 and the fourth region 114 of the upper surface 11 are defines a recess at the portion intersecting with the corresponding inner lateral surface 14 in a top view. The width of the upper surface 11 (the distance between the inner lateral surface 14 and the outer lateral surface 15) is greater at the portions on both sides of each of the recesses than at the recesses.

As used herein, the portions of the upper surface 11 having a smaller width at the recess is referred to as "narrow portions of the upper surface 11", and the portions of the upper surface 11 having a greater width on both sides of the recess is referred to as "wide portions of the upper surface 11". In a top view, in each of the second region 112 and the fourth region, the second stepwise portion 163 is located between a line passing through the inner lateral surface 14 of the wide portion and the line passing through the outer lateral surface 115.

In the light emitting device 2, alignment marks 19 are located at the wide portions of the upper surface 11. Each of the alignment marks 19, namely, a first alignment mark 191 and a second alignment mark 192, is formed by disposing a metal film to surround the region serving as the alignment mark. Specific examples of a method of forming the aliment marks 19 include disposing a metal film over a mask disposed on a region where the alignment mark is to be provided, and then removing the mask. Alternatively, for example, after disposing a metal film, a portion of the metal film where the alignment mark is to be provided may be removed.

When forming the alignment mark using the metal film 171, there may be a case in which disposing the metal film to surround the region serving as the alignment mark, as in the light emitting device 2, is more stably performed than disposing the metal film to include a portion having a shape of the alignment mark, as in the light emitting device 1. On the other hand, disposing the metal film to surround the region serving as the alignment mark requires a greater region for forming the alignment mark than when disposing the metal film to include a portion having a shape of the alignment mark.

In the light emitting device 1, when the base member has a shape in which each second stepwise portion is formed over the entire length of a corresponding one of the sides corresponding to the frame, a size of the outer shape of the base member is required to be increased in order to form the alignment mark by disposing the metal film to include a portion having a shape of the alignment mark. When each second stepwise portion is partially formed along a corresponding one of the sides corresponding to the frame as in the light emitting device 2, the alignment mark can be formed by disposing the metal film to surround the region serving as the alignment mark without increasing the size of the outer shape of the base member.

Accordingly, in a top view, a line parallel to the side corresponding to the frame in the first region 111 or the third region 113 and passing through the first alignment mark 191 or the second alignment mark 192 does not intersect with a corresponding one of the second stepwise portions 163. Each of the second stepwise portions 163 is formed in the region between the line parallel to the side corresponding to the frame in the first region 111 or the third region 113 and passing through the first alignment mark 191 and the line parallel to the side corresponding to the frame in the first region 111 or the third region 113 and passing through the second alignment mark 192, and not formed outside this region. The line connecting the first alignment mark 191 and the second alignment mark 192 does not intersects with the second stepwise portions 163.

In the light emitting device 2, in the direction of the side corresponding to the frame in the second region 112, the length of the first stepwise portion 161 is greater than the length of the second stepwise portion 163. The difference in length between the first stepwise portion 161 and the second stepwise portion 163 is greater than that in the light emitting device 1. The second wirings 72 are bonded to the metal films on the upper surfaces of the second stepwise portions 163.

The light-shielding member 101 may be disposed by, for example, pouring a resin, and heating to cure the poured resin. The resin is formed of an insulating material, and functions as an insulating member which protects the second wirings 72 from unintended electric conduction due to an external factor. In order to protect the second wirings 72 from unintended electric conduction, the insulating member is required to be formed so that the second wirings 72 are not exposed outside. As has been described above, the second stepwise portion 163 of the light emitting device 2 has a length smaller than a length of the first stepwise portion 161*m* which facilitates control of the pouring the resin.

While certain embodiments of the present invention have been described above, the present invention is not limited to the configuration of the light emitting device in embodiments described in the present specification. For example, the present invention is applicable to a light emitting device additionally including an element which is not described in the embodiments described above. Merely having a difference from the light emitting device described above does not form the grounds for the inapplicability of the present invention.

That is, the present invention is also applicable to a device not including every element of the light emitting device in the embodiments described above. For example, when the claims do not recite some of the manufacturing steps in manufacturing of the light emitting device or some elements of the light emitting device in the embodiments described above, a light emitting device or a method of manufacturing a light emitting device including elements or manufacturing steps not described in the claims is within the scope of the claims, while any appropriate configurations other than those described above may be employed and flexibility in design such as replacement, omission, change of shape, change of material, etc., may be made by a person skilled in the art.

The light emitting device according to certain embodiments of the present invention is applicable to a light source for a vehicle headlight, illumination, a projector, a head-mounted display, a backlight for any other display and the like.

What is claimed is:

1. A method of manufacturing a light emitting device, the method comprising:
    disposing a first semiconductor laser element on a disposition surface of a base member such that a light emission end surface of the first semiconductor laser element is parallel to a first line passing through a pair of alignment marks provided on the base member;
    disposing a first light-reflective member on the disposition surface such that a reference line for the first light-reflective member, which serves as an alignment reference in disposing the first light-reflective member, is parallel to a second line that is oblique to the first line at a predetermined angle
    disposing a second semiconductor laser element on the disposition surface such that a light emission end surface of the second semiconductor laser element is parallel to the first line, and such that the first semiconductor laser element and the second semiconductor laser element are disposed symmetrically to each other with reference to a midpoint of the first line between the alignment marks; and
    disposing a second light-reflective member on the disposition surface such that a reference line for the second light-reflective member is parallel to the second line, and such that the first light-reflective member and the second light-reflective member are disposed symmetrically to each other with reference to the midpoint of the first line.

2. The manufacturing method according to claim 1, wherein the predetermined angle is in a range of 10 degrees to 80 degrees.

3. The manufacturing method according to claim 1, further comprising
    disposing a wavelength conversion member including a wavelength conversion part and a surrounding part surrounding lateral surfaces of the wavelength conversion part, the wavelength conversion member being disposed above the first semiconductor laser element and the second semiconductor laser element such that the midpoint of the first line overlaps the wavelength conversion part in a top view.

4. The manufacturing method according to claim 1, wherein the disposing of the first semiconductor laser element on the disposition surface is performed after the disposing of the first light-reflective member on the disposition surface.

5. The manufacturing method according to claim 1, wherein the disposing of the first light-reflective member includes disposing the first light-reflective member by using a straight line passing through a side corresponding an upper edge or lower edge of a light-reflective surface of the first light-reflective member as the reference line.

6. A light emitting device comprising:
    a base member including a disposition surface, and including a pair of alignment marks;
    a first semiconductor laser element disposed on the disposition surface;
    a second semiconductor laser element disposed on the disposition surface;
    a first light-reflective member disposed on the disposition surface; and
    a second light-reflective member disposed on the disposition surface, wherein
    the first semiconductor laser element and the first light-reflective member are disposed on the disposition surface such that a light emission end surface of the first semiconductor laser element and an upper edge or a lower edge of a light-reflective surface of the first light-reflective member form a predetermined angle without being perpendicular or parallel to each other in a top view,
    the second semiconductor laser element and the second light-reflective member are disposed on the disposition surface such that a light emission end surface of the second semiconductor laser element and an upper edge or a lower edge of a light-reflective surface of the second light-reflective member form the predetermined angle in the top view,
    a line connecting the alignment marks extends parallel to the light emission end surface of the first semiconductor laser element and the light emission end surface of the second semiconductor laser element,
    the first semiconductor laser element and the second semiconductor laser element are disposed symmetrically to each other with reference to a midpoint of the line, and
    the first light-reflective member and the second light-reflective member are disposed symmetrically to each other with reference to the midpoint.

7. The light emitting device according to claim 6, wherein the predetermined angle is in a range of 10 degrees to 80 degrees.

8. The light emitting device according to claim 6, further comprising
    a wavelength conversion member including a wavelength conversion part and a surrounding part surrounding lateral surfaces of the wavelength conversion part, the wavelength conversion member being disposed above the first semiconductor laser element and the second semiconductor laser element such that the midpoint overlaps the wavelength conversion part in the top view.

9. The light emitting device according to claim 6, wherein the base member including
an upward-facing surface,
an upper surface surrounding the upward-facing surface to form a rectangular frame in the top view, the rectangular frame having four sides including a first side, a second side intersecting with the first side, a third side opposite to the first side and intersecting with the second side, and a fourth side intersecting with the third side and the first side in the top view,
a first metal film extending from a region corresponding to the first side to a region corresponding to the second side in the upper surface, and
a second metal film extending from a region corresponding to the third side to a region corresponding to the fourth side, wherein
the first metal film includes
a first conduction region configured to establish electrical connection in the region corresponding to the first side, and
a first alignment region defining one of the pair of alignment marks in the region corresponding to the second side, and
the second metal film includes
a second conduction region configured to establish electrical connection in the region corresponding to the third side, and
a second alignment region defining the other one of the pair of alignment marks in the region corresponding to the fourth side.

10. The light emitting device according to claim 9, wherein
the base member includes another pair of alignment marks provided on the disposition surface, and
the line connecting the pair of alignment marks and a line connecting the another pair of alignment marks are parallel to each other.

11. The light emitting device according to claim 6, wherein the pair of alignment marks are provided on the disposition surface.

12. A method of manufacturing a light emitting device, the method comprising:
disposing a first semiconductor laser element on a disposition surface of a base member such that a light emission end surface of the first semiconductor laser element is parallel to a first line passing through a pair of alignment marks provided on the base member; and
disposing a first light-reflective member on the disposition surface such that a reference line for the first light-reflective member, which serves as an alignment reference in disposing the first light-reflective member, is parallel to a second line that is oblique to the first line at a predetermined angle, wherein
the disposing of the first light-reflective member includes disposing the first light-reflective member by using a straight line passing through a side corresponding an upper edge or lower edge of a light-reflective surface of the first light-reflective member as the reference line.

13. The manufacturing method according to claim 12, wherein the predetermined angle is in a range of 10 degrees to 80 degrees.

14. The manufacturing method according to claim 2, further comprising
disposing a wavelength conversion member including a wavelength conversion part and a surrounding part surrounding lateral surfaces of the wavelength conversion part, the wavelength conversion member being disposed above the first semiconductor laser element and the second semiconductor laser element such that the midpoint of the first line overlaps the wavelength conversion part in a top view.

15. The manufacturing method according to claim 12, wherein the disposing of the first semiconductor laser element on the disposition surface is performed after the disposing of the first light-reflective member on the disposition surface.

* * * * *

UNITED STATES PATENT AND TRADEMARK OFFICE
CERTIFICATE OF CORRECTION

PATENT NO. : 11,303,095 B2
APPLICATION NO. : 16/791791
DATED : April 12, 2022
INVENTOR(S) : Tadayuki Kitajima et al.

It is certified that error appears in the above-identified patent and that said Letters Patent is hereby corrected as shown below:

In the Claims

In Claim 1, in Line 45 in Column 21, delete "at a predetermined angle", and insert -- at a predetermined angle; --.

In Claim 14, in Line 24 in Column 24, delete "claim 2", and insert -- claim 12 --.

Signed and Sealed this
Twenty-fifth Day of October, 2022

Katherine Kelly Vidal
*Director of the United States Patent and Trademark Office*